(12) United States Patent
Yoon et al.

(10) Patent No.: US 9,012,944 B2
(45) Date of Patent: Apr. 21, 2015

(54) LIGHT EMITTING DEVICE, LIGHT EMITTING DEVICE PACKAGE AND ILLUMINATION SYSTEM FOR REDUCING DISLOCATION IN SEMICONDUCTOR LAYER

(71) Applicant: LG Innotek Co., Ltd., Seoul (KR)

(72) Inventors: Ho Sang Yoon, Seoul (KR); Sang Kyun Shim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/968,599

(22) Filed: Aug. 16, 2013

(65) Prior Publication Data

US 2013/0334550 A1 Dec. 19, 2013

Related U.S. Application Data

(63) Continuation of application No. 12/948,857, filed on Nov. 18, 2010, now Pat. No. 8,563,999.

(30) Foreign Application Priority Data

Jan. 19, 2010 (KR) .................. 10-2010-0004673

(51) Int. Cl.
*H01L 33/00* (2010.01)
*H01L 29/15* (2006.01)
*H01L 33/12* (2010.01)
*H01L 33/32* (2010.01)

(52) U.S. Cl.
CPC ............ *H01L 33/0025* (2013.01); *H01L 33/12* (2013.01); *H01L 33/32* (2013.01); *H01L 2924/0002* (2013.01); *H01L 2224/48091* (2013.01)

(58) Field of Classification Search
None
See application file for complete search history.

(56) References Cited

U.S. PATENT DOCUMENTS

| | | | |
|---|---|---|---|
| 6,657,236 B1 * | 12/2003 | Thibeault et al. | 257/98 |
| 6,967,359 B2 * | 11/2005 | Kamiyama et al. | 257/190 |
| 7,132,691 B1 * | 11/2006 | Tanabe et al. | 257/79 |
| 2002/0014629 A1 | 2/2002 | Shibata et al. | |
| 2004/0248377 A1 | 12/2004 | Yoo et al. | |
| 2005/0230699 A1 | 10/2005 | Wu et al. | |
| 2007/0241350 A1 | 10/2007 | Kim | |
| 2008/0048176 A1 * | 2/2008 | Orita et al. | 257/22 |
| 2008/0142824 A1 | 6/2008 | Chen et al. | |
| 2008/0169482 A1 | 7/2008 | Kang | |
| 2008/0251803 A1 | 10/2008 | Cho et al. | |
| 2009/0272993 A1 | 11/2009 | Cheong | |
| 2010/0252850 A1 | 10/2010 | Park et al. | |
| 2011/0012169 A1 * | 1/2011 | Takizawa et al. | 257/103 |

FOREIGN PATENT DOCUMENTS

| | | |
|---|---|---|
| EP | 1104031 A2 | 5/2001 |
| JP | 2002-008998 A | 1/2002 |
| JP | 2006-140357 A | 6/2007 |

(Continued)

*Primary Examiner* — Michael Jung
(74) *Attorney, Agent, or Firm* — Birch, Stewart, Kolasch & Birch, LLP

(57) ABSTRACT

A light emitting device is provided. The light emitting device includes a first semiconductor layer, an uneven part on the first semiconductor layer, a first nonconductive layer including a plurality of clusters on the uneven part, a first substrate layer on the nonconductive layer, and a light emitting structure layer. The light emitting structure layer includes a first conductive type semiconductor layer, an active layer and a second conductive type semiconductor layer on the first substrate layer.

17 Claims, 8 Drawing Sheets

(56) References Cited

FOREIGN PATENT DOCUMENTS

| JP | 2008-277650 A | 11/2008 | | |
|---|---|---|---|---|
| KR | 1993-0015141 A | 7/1993 | | |
| KR | 10-0483049 B1 | 12/2004 | | |
| KR | 10-2009-0046602 A | 5/2009 | | |
| WO | WO 2009/118979 A1 | * | 10/2009 | ............. H01L 33/00 |

* cited by examiner

LIGHT EMITTING DEVICE, LIGHT EMITTING DEVICE PACKAGE AND ILLUMINATION SYSTEM FOR REDUCING DISLOCATION IN SEMICONDUCTOR LAYER

CROSS-REFERENCE TO RELATED APPLICATIONS

This application is a Continuation of co-pending U.S. patent application Ser. No. 12/948,857 filed on Nov. 18, 2010, which claims priority under 35 U.S.C. 119 and 35 U.S.C. 365 to Korean Patent Application No. 10-2010-0004673 (filed on Jan. 19, 2010), which is hereby incorporated by reference in its entirety.

BACKGROUND

The present disclosure relates to a light emitting device, light emitting device package, and an illumination system provided with them.

Group III-V nitride semiconductors have been widely used as the core materials of light emitting devices such as Light Emitting Diodes (LED) and Laser Diodes (LD), in physical and chemical characteristics. The group III-V nitride semiconductors consist of semiconductor materials having the composition equation of $In_xAl_yGa_{1-x-y}N$ (where $0 \leq x \leq 1$, $0 \leq y \leq 1$, and $0 \leq x+y \leq 1$).

The LED is a sort of semiconductor device that changes electricity into infrared rays or light by using the characteristics of compound semiconductors to input/output a signal, or is used as a light source.

The LED or the LD with nitride semiconductor materials is much applied to the light emitting devices for obtaining light. For example, the LED or the LD is applied as the light sources of all sorts of products such as the light emitting portions of the key pads of cellular phones, electronic display boards and lighting devices.

SUMMARY

Embodiments provide a light emitting device capable of reducing dislocation in a semiconductor layer.

Embodiments provide a light emitting device having structure layers for reducing dislocation between a substrate and an active layer.

Embodiments provide a light emitting device, and a light emitting device package and an illumination system provided with the same.

In one embodiment, a light emitting device comprises a first semiconductor layer; an uneven part on the first semiconductor layer; a first nonconductive layer including a plurality of clusters on the uneven part; a first substrate layer on the nonconductive layer; and a light emitting structure layer including a first conductive type semiconductor layer, an active layer and a second conductive type semiconductor layer on the first substrate layer.

In another embodiment, a light emitting device comprises a first semiconductor layer including an uneven part; a discontinuous nonconductive layer on the uneven part of the first semiconductor layer; a substrate layer including an uneven structure on the nonconductive layer; and a light emitting structure layer including a plurality of compound semiconductor layers on the substrate layer, wherein lattice constant difference between the substrate layer and nitride semiconductor is equal to or lower than about 5%.

DETAILED DESCRIPTION OF THE EMBODIMENTS

In the descriptions of embodiments, it will be understood that when a layer (or film), a region, a pattern, or a structure is referred to as being 'on' substrate, each layer (or film), a region, a pad, or patterns, it can be directly on substrate each layer (or film), the region, the pad, or the patterns, or intervening layers may also be present. Further, it will be understood that when a layer is referred to as being 'under' each layer (film), the region, the pattern, or the structure, it can be directly under another layer (film), another region, another pad, or another patterns, or one or more intervening layers may also be present.

A dimension of each of elements may be exaggerated for clarity of illustration, and the dimension of each of the elements may be different from an actual dimension of each of the elements.

Hereinafter, embodiments will be described with reference to the accompanying drawings.

Figure 1:
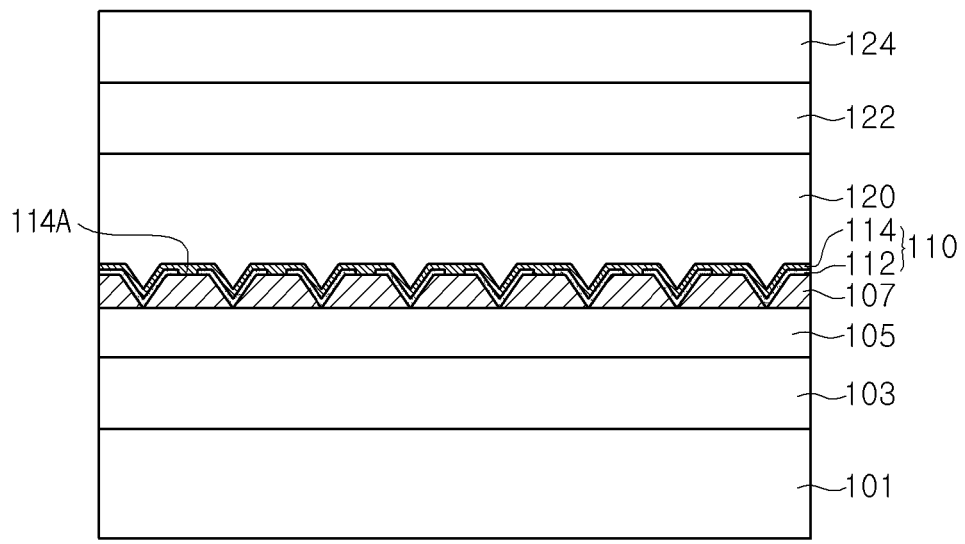
FIG. 1 is a side-sectional view illustrating a light emitting device according to a first embodiment.

FIG. 1 is a diagram illustrating a light emitting device according to a first embodiment.

Referring to FIG. 1, a light emitting device 100 includes a substrate 101, a buffer layer 103, a first semiconductor layer 105, an uneven part 107, a nonconductive layer 112, a substrate layer 114, a first conductive type semiconductor layer 120, an active layer 122, and a second conductive type semiconductor layer 124.

At least one of sapphire ($Al_2O_3$), SiC, Si, GaAs, GaN, ZnO, Si, GaP, InP, Ge, and $Ga_2O_3$ may be used for the substrate 101. An uneven pattern may be formed on an upper surface of the substrate 101. The uneven pattern may be formed by etching the substrate or by using special material.

The buffer layer 103 is formed on the substrate 101. The buffer layer 103 may be formed for reducing a lattice constant difference between the substrate 101 and a nitride semiconductor. The buffer layer 103 may be formed in a layer or pattern using, e.g., group II to VI compound semiconductor. Preferably, the buffer layer 103 may include group III-V compound semiconductor, e.g., at least one selected from a group of GaN, InN, AlN, InGaN, AlGaN, InAlGaN, and AlInN. The buffer layer 103 may also be formed with oxide such as a ZnO layer, or it may not be formed; however, it is not limited to this.

The first semiconductor layer 105 may be formed on the substrate 101 or the buffer layer 103. The first semiconductor layer 105 may be formed for improving crystallinity of a semiconductor layer.

The first semiconductor layer 105 includes semiconductor material having a composition equation of $In_xAl_yGa_{1-x-y}N$ ($0 \le x \le 1$, $0 \le y \le 1$, $0 \le x+y \le 1$) using group III-V compound semiconductor.

The first semiconductor layer 105 may be formed in an undoped semiconductor layer or a first conductive type semiconductor layer. The undoped semiconductor layer is, e.g., an undoped nitride-based semiconductor, where conductive dopant is not doped intentionally. The undoped semiconductor layer has a noticeably lower conductivity than that of the first conductive type semiconductor layer. For instance, the undoped semiconductor layer may be an undoped GaN layer and may have characteristics of the first conductive type. The first conductive type semiconductor layer may include a semiconductor doped with the first conductive dopant, e.g., at least one of GaN, InN, AlN, InGaN, AlGaN, InAlGaN, and AlInN. Hereinafter, for convenience of explanation, it is assumed that the first semiconductor layer 105 is the undoped semiconductor layer.

The uneven part 107 is formed on the first semiconductor layer 105. The uneven part 107 includes the semiconductor material having the composition equation of $In_xAl_yGa_{1-x-y}N$ ($0 \le x \le 1$, $0 \le y \le 1$, $0 \le x+y \le 1$) using group III-V compound semiconductor. The uneven part 107 may be formed with the same material as the first semiconductor layer 105. The uneven part 107 includes at least one of structures of unevenness, roughness, and texture and may include a regular or irregular size.

At the uneven part 107, concave parts and convex parts are alternately arranged. A plurality of the concave parts may be formed in a rod shape or such a shape whose lower width is larger than its upper width, e.g., a truncated cone or polygonal shape. At the convex parts of the uneven part 107, substantially flat upper surfaces are formed at predetermined intervals. There may be no flat section at the concave part.

The convex parts may be discontinuously arranged on the first semiconductor layer 105 being separated from each other.

The uneven part 107 may be formed with the semiconductor doped with the first conductive dopant or the undoped nitride-based semiconductor.

The nonconductive layer 112 is formed on the uneven part 107, and the substrate layer 114 is formed on the nonconductive layer 112.

The nonconductive layer 112 is a mask layer whose resistance is larger than that of the uneven part 107 or the undoped semiconductor layer. The nonconductive layer 112 may be formed in an irregular cluster form and, e.g., may be formed with MgN, SiN, or ZnN.

The nonconductive layer 112 is formed in discontinuous clusters, and each cluster has a random shape and a random size and may be formed to a diameter of more than several angstroms.

The substrate layer 114 may be embodied as a conductive layer, an insulating layer, or a nonconductive layer and is formed on the nonconductive layer 112. Herein, a part 114A of the substrate layer 114 may be contacted on the uneven part 107 through a gap of the nonconductive layer 112. The substrate layer 114 may be layered as an uneven shape on the nonconductive layer 112.

The substrate layer 114 is substrate material where the nitride semiconductor may be grown. The substrate layer 114 may be embodied as carbon-containing material or silicon-based semiconductor whose lattice constant is almost similar to that of the nitride semiconductor. The substrate layer 114 may be formed with different material from the nitride semiconductor, e.g., silicon carbide (SiC) layer. Herein, GaN has the lattice constant of a=about 3.189 Å and c=about 5.185 Å. The lattice constant difference between SiC and the nitride semiconductor is lower than at least about 1 or about 5%.

A thickness of the silicon carbide (SiC) layer may range from about 5 Å to about 500 Å. The silicon carbide (SiC) layer may include the first conductive dopant. The first conductive dopant is N-type dopant and may include Si, Ge, Sn, Se, and Te. Doping concentration of this dopant is not limited.

The silicon carbide layer may be embodied with carbon-containing material, e.g., silicon carbon nitride (SiCN) layer or carbon nitride (CN) layer. The substrate layer 114 may also be embodied with silicon nitride group, e.g., SiN.

The nonconductive layer 112 and the substrate layer 114 may be alternately layered. A layering period of the nonconductive layer 112 and the substrate layer 114 is equal to or lower than 20 periods, wherein a thickness of one period may range from about 1 nm to about 100 nm. In the layered structure 110 of the nonconductive layer 112 and the substrate layer 114, the substrate layer 114 usable as semiconductor layer is disposed as an uppermost layer.

The dislocation occurs due to the lattice constant difference between the substrate 101 and the nitride semiconductor layer. The dislocation is transferred through the buffer layer 103 and the first semiconductor layer 105.

Since the convex parts of the uneven part 107 are separated from each other, there is an effect of reducing substantial contact area. Accordingly, the number of dislocations which exist at the uneven part 107 may be reduced than that of dislocations which exist at the first semiconductor layer 105. The uneven part 107 may reduce the dislocation transferred through the first semiconductor layer 105. Therefore, the first conductive type semiconductor layer 120 has a lower dislocation density than that of the first semiconductor layer 105.

The nonconductive layer 112 may again reduce the dislocation ascending through the uneven part 107. The nonconductive layer 112 may suppress the dislocation transferred from the uneven part 107 by using a resistance difference with the uneven part 107.

If the layering period of the nonconductive layer 112 and the substrate layer 114 is 2 or more, the dislocation may be more suppressed. Accordingly, a surface of the semiconductor layer on the substrate layer 114 may be formed in a thin film without crack.

The first conductive type semiconductor layer 120 may be formed on the nonconductive layer 112. The first conductive type semiconductor layer 120 may include, e.g., the composition equation of $In_xAl_yGa_{1-x-y}N$ ($0 \le x \le 1$, $0 \le y \le 1$, $0 \le x+y \le 1$) of group III-V compound semiconductor doped with the first dopant.

The first conductive type semiconductor layer 120 has a thickness of more than about 3 µm and may be formed in a single layer or multi layers. The dopant concentration of the first conductive type semiconductor layer 120 may be higher than that of the undoped semiconductor layer.

The first conductive type semiconductor layer 120 includes N-type semiconductor layer, and the first conductive dopant includes N-type dopant such as Si, Ge, Sn, Se, and Te.

The active layer 122 is formed on the first conductive type semiconductor layer 120. The active layer 122 may be formed in a single quantum well structure, a multi-quantum well structure, a quantum wire structure, or a quantum dot structure. The active layer 122 may be formed in a period of a well layer and a barrier layer using group III-V compound semiconductor material. For instance, the active layer 122 may be formed in a period of InGaN well layer/GaN barrier layer, a period of InGaN well layer/AlGaN barrier layer, and a period of InGaN well layer/InGaN barrier layer; however, there is no limit for this. A band gap of the barrier layer may be higher than that of the well layer.

A conductive clad layer may be formed on or/and under the active layer 122. The conductive clad layer may be formed with GaN-based semiconductor layer. The band gap of the conductive clad layer may be higher than that of the barrier layer.

The second conductive type semiconductor layer 124 is formed on the active layer 122. The second conductive type semiconductor layer 124 may be selected from group III-V compound semiconductors doped with second conductive dopant, e.g., GaN, AlN, AlGaN, InGaN, InN, InAlGaN, AlInN, AlGaAs, GaP, GaAs, GaAsP, and AlGaInP. In the case that the second conductive type is P-type semiconductor, the second conductive dopant includes P-type dopant such as Mg and Zn. The second conductive type semiconductor layer 124 may be foamed in a single layer or multi layers, and it is not limited to this.

According to the embodiment, since the dislocation is suppressed by using the uneven part 107, the nonconductive layer 112, and the substrate layer 114 disposed under the first conductive type semiconductor layer 120, the first conductive type semiconductor layer 120, the active layer 122, and the second conductive type semiconductor layer 124 may be formed in thin films without crack. The crack-free thin layer are capable of preventing current concentration so that the device may be protected from electrostatic discharge (ESD). The crystallinity of the semiconductor layer is also improved so that internal quantum efficiency and external quantum efficiency may be improved.

A lower part of the first conductive type semiconductor layer 120 may be formed in a rough structure along the uneven surface of the substrate layer 114. The rough structure may improve light extraction efficiency.

The first conductive type semiconductor layer 120 may be formed with P-type semiconductor layer, and the second conductive type semiconductor layer 124 may be formed with N-type semiconductor layer. On the second conductive type semiconductor layer 124, the N-type semiconductor layer having opposite polarity from the second conductive type may be formed. In the light emitting device 100, the first conductive type semiconductor layer 120, the active layer 122, and the second conductive type semiconductor layer 124 may be defined as a light emitting structure layer. The light emitting structure layer may be embodied as one of structures of N-P junction, P-N junction, N-P-N junction, and P-N-P junction.

At least one of a transparent electrode layer (not illustrated), a reflection electrode layer, and an electrode may be formed on the light emitting structure layer. The transparent electrode layer may be formed with material including transparent oxide or metal on the second conductive type semiconductor layer 124. For instance, the transparent electrode layer may be formed in a single layer or multi layers using one or more of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni, Ag, Ni/IrOx/Au, and Ni/IrOx/Au/ITO.

The reflection electrode layer may be formed with material composed of Ag, Ni, Al, Rh, Pd, Ir, Ru, Mg, Zn, Pt, Au, and Hf and their selective combination on the light emitting structure layer. The electrode may include at least one from a group of Ti, Al, In, Ta, Pd, Co, Ni, Si, Ge, Ag, and Au. The electrode may include an electrode pad and may further include a current diffusion pattern.

The light emitting device 100 is capable of suppressing the dislocation generated due to lattice mismatch with the substrate by the layered structure 110 of the nonconductive layer 112 and the substrate layer 114. The light emitting device 100 is also capable of improving the crystallinity of the semiconductor layers according to growth of nitride semiconductor layer and the light extraction efficiency.

FIGS. 2 to 6 are diagrams illustrating a method for fabricating the light emitting device according to the first embodiment.

Figure 2:
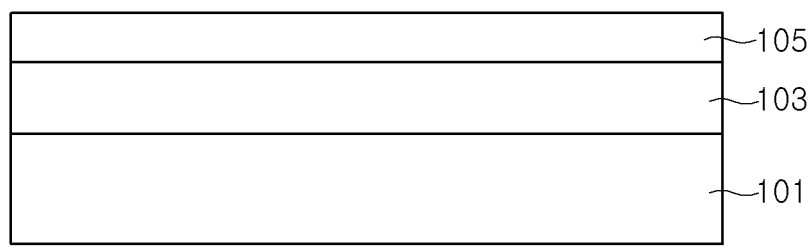
FIGS. 2 to 6 are diagrams illustrating a method for fabricating the light emitting device according to the first embodiment.

Referring to FIG. 2, the substrate 101 is loaded on growth equipment, and a plurality of compound semiconductor layers are layered on the substrate 101.

The growth equipment may include electron beam evaporator, Physical Vapor Deposition (PVD), Chemical Vapor Deposition (CVD), Plasma Laser Deposition (PLD), dual-type thermal evaporator sputtering, Metal Organic Chemical Vapor Deposition (MOCVD) and the like, and the growth equipment is not limited to the listed equipment.

At least one of sapphire ($Al_2O_3$), SiC, Si, GaAs, GaN, ZnO, Si, GaP, InP, Ge, and $Ga_2O_3$ may be used for the substrate 101. The uneven pattern may be formed on the upper surface of the substrate 101. The uneven pattern may be forming by etching the substrate 101 or may be formed in an optical extraction structure such as roughness structure with special material.

The buffer layer 103 may be formed on the substrate 101 and may be formed in a layer or pattern using group II to VI compound semiconductor. The buffer layer 103 may not be formed, and it is not limited whether to form the buffer layer 103.

The first semiconductor layer 105 may be formed on the substrate 101 or the buffer layer 103. The first semiconductor layer 105 may be formed with the undoped semiconductor using group III-V compound semiconductor or the N-type semiconductor layer. The undoped semiconductor is, e.g., the nitride-based semiconductor, and is not doped with the conductive dopant intentionally. The N-type semiconductor may be formed with the semiconductor doped with the first conductive dopant.

In the case that the first semiconductor layer 105 is, e.g., the undoped GaN, it is formed to a predetermined thickness by supplying $NH_3$ and TMGa (or TEGa) at a first growth temperature (e.g., from about 500° C. to about 900° C.).

Figure 3:
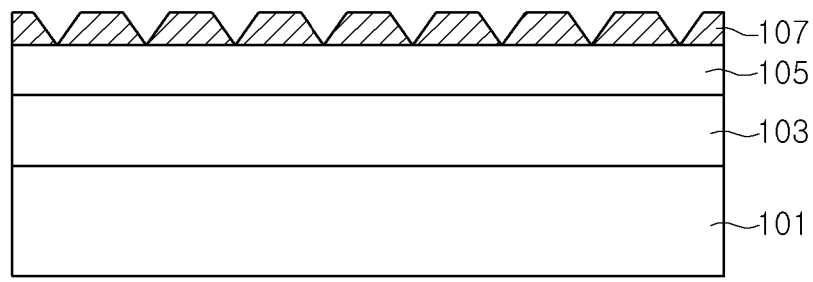

Referring to FIG. 3, the uneven part 107 is formed on the first semiconductor layer 105. The uneven part 107 may include the semiconductor using group III-V compound semiconductor. The uneven part 107 may be embodied with the semiconductor layer doped with the first conductive dopant or the undoped semiconductor layer. The first semiconductor layer 105 and the uneven part 107 may be formed with the undoped semiconductor layer.

The convex part of the uneven part 107 may be formed in, e.g., random rod shape, cone or polygonal shape.

In the case that the uneven part 107 is, e.g., the undoped GaN, it is formed to a predetermined thickness by supplying $NH_3$ and TMGa (or TEGa) at a second growth temperature (e.g., from about 200° C. to about 600° C.) lower than the first growth temperature. Herein, the second growth temperature may be lower than the first growth temperature by, e.g., from about 300° C. to about 500° C. Through this low temperature growth, the convex parts of the uneven part 107 may be separated from each other. Herein, although the uneven part 107 is formed by condition of lowering temperature in the embodiment, the convex parts whose upper parts are discontinuous may be formed by adjusting conditions such as increasing growth pressure or increasing flux of Ga.

The lower width of the convex part of the uneven part 107 is larger than its upper width, and the convex part may be formed in a circle or polygon shape from a top view. The convex part of the uneven part 107 may include the flat section.

Figure 4:
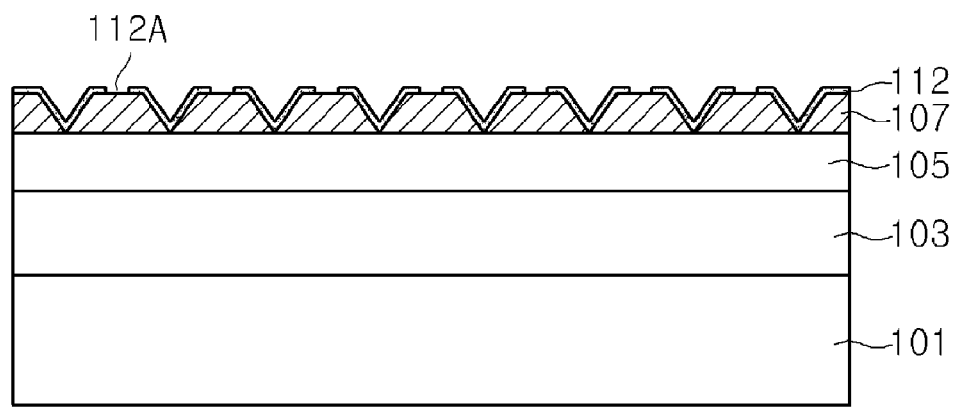

Referring to FIG. 4, the plurality of nonconductive parts 112 are formed on the uneven part 107.

The nonconductive parts 112 may be formed in the plurality of clusters shape or discontinuous structures having random shapes and sizes. The nonconductive layer 112 may be for med with nonconductor including the first conductive dopant or the second conductive dopant. For instance, the nonconductive layer 112 may be formed with MgN, SiN, and ZnN. A hole 112A is formed between the nonconductive layer 112. Through the hole 112A, a part of the uneven part 107 may be exposed.

Figure 5:
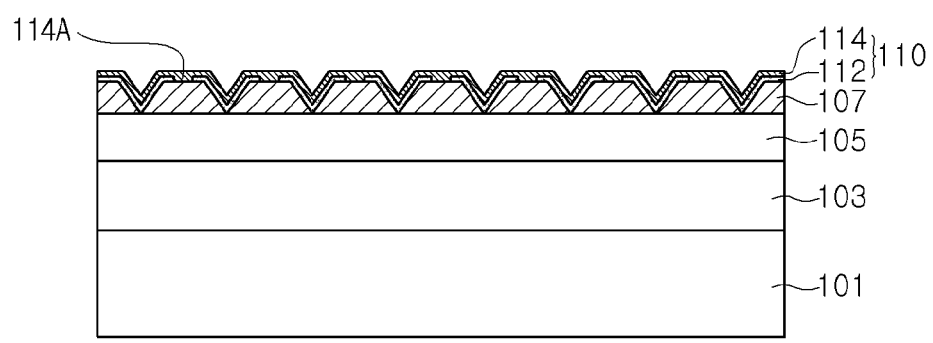

Referring to FIGS. 4 and 5, the substrate layer 114 may be formed on the nonconductive layer 112.

The substrate layer 114 may be formed with material whose lattice constant difference from the nitride semiconductor is at most about 1 (i.e., below about 5%). Herein, GaN has the lattice constant of a=about 3.189 Å and c=about 5.185 Å.

The substrate layer 114 may be formed with, e.g., ceramic-based semiconductor or silicon-based semiconductor. For instance, the substrate layer 114 may be formed with SiC. For another example, the substrate layer 114 may have conductive, nonconductive, or insulating characteristics. Since the substrate layer 114 is provided as a seed layer of a thin film, it is economically advantageous in comparison with using expensive SiC substrate.

The part 114A of the substrate layer 114 may be extended through the nonconductive layer 112 and contacted on the uneven part 107.

The nonconductive layer 112 and the substrate layer 114 may be formed at the growth temperature substantially ranging from about 500° C. to about 1000° C. In the case of growing the nonconductive layer 112 with MgN, it may be grown to a thickness of more than several angstroms by supplying dopant source including $NH_3$ and Mg. In the case that the substrate 114 is SiC, it may be formed by reaction of silicon and carbon in the evaporator. $SiH_3$, $Si_2H_6$, and DTBSi may be used as the silicon material, and $CBr_4$ or CxHy may be used as the carbon material. A thickness of the SiC layer may range from about 5 Å to about 500 Å. The silicon carbide layer may be doped with the first conductive dopant. However, such doping concentration, thickness, and growth temperature may be varied. The silicon carbide layer may also be embodied with another material, e.g., carbon-containing material such as silicon carbon nitride (SiCN) or carbon nitride (CN).

The nonconductive layer 112 is highly nonconductive in comparison with the uneven part 107 and may suppress the dislocation ascending from the first semiconductor layer 105.

A pair of the nonconductive layer 112 and the substrate layer 114 may be grown to from at least 1 period to 20 periods. Herein, a thickness of one period may range from about 1 nm to about 100 nm. In the layered structure 110 of the nonconductive layer 112 and the substrate layer 114, the substrate layer 114 whose combining strength with the nitride semiconductor layer is relatively better may be disposed as the uppermost layer.

The uneven part 107 may reduce the dislocation ascending from the first semiconductor layer 105 under the uneven part 107, and the nonconductive layer 112 may again reduce the dislocation ascending through the uneven part 107. That is, the uneven part 107 may reduce an area where the dislocation may ascend by the rod shape, and the nonconductive layer 112 may almost completely cut off the dislocation because the nonconductive layer 112 is formed in the cluster shape on the uneven part 107.

Since the cluster having high resistance is discontinuously formed to a random shape as the nonconductive layer 112 on the uneven part 107, the dislocation generated due to the lattice constant mismatch between the substrate 101 and the nitride semiconductor may be reduced. The random shape may include a polyhedral shape. Herein, the substrate layer 114 formed on the nonconductive layer 112 may be contacted to the layer under the nonconductive layer 112.

In the case that the pair of the nonconductive layer 112 and the substrate layer 114 is formed to several periods, the dislocation may be more suppressed. The semiconductor layer surface on the substrate layer 114 may be formed in the crack-free thin film.

The semiconductor layer may be grown on the substrate layer 114. For instance, one of buffer layer, undoped semiconductor layer, and first conductive type semiconductor layer may be formed in the semiconductor layer using group III-V semiconductor. Hereinafter, for convenience of explanation, it is assumed that the first conductive type semiconductor layer is formed on the substrate layer 114.

Figure 6:
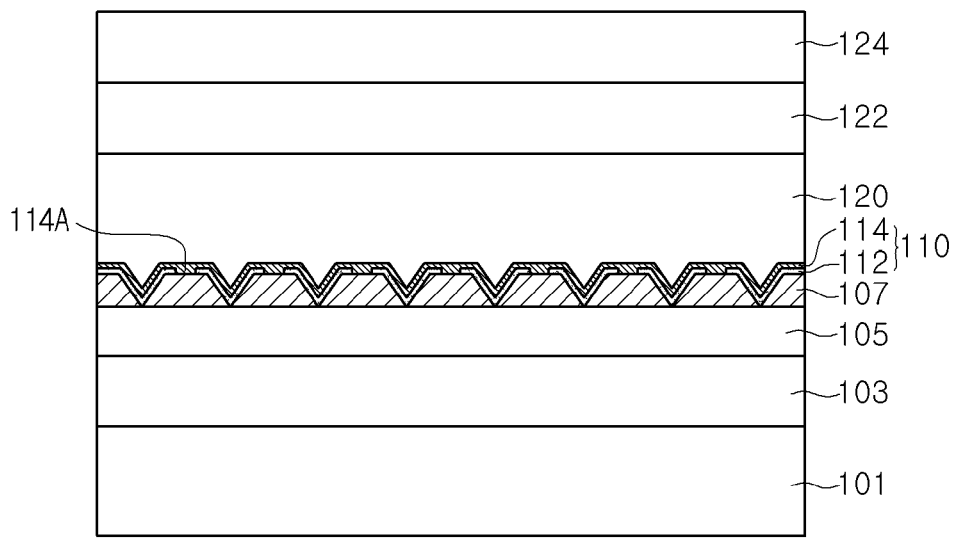

Referring to FIG. 6, the first conductive type semiconductor layer 120 may be formed on the substrate 114. The first conductive type semiconductor layer 120 may include group III-V compound semiconductor doped with the first conductive dopant, e.g., at least one selected from a group of GaN, InN, AlN, InGaN, AlGaN, InAlGaN, and AlInN. In the case that the first conductive type semiconductor layer 120 is N-type semiconductor layer, the first conductive dopant includes Si, Ge, Sn, Se, and Te as N-type dopant.

The active layer 122 is formed on the first conductive type semiconductor layer 120. The active layer may be formed in the single quantum well structure, multi-quantum well (MQW) structure, quantum dot structure, or quantum wire structure and may be fanned using group III-V compound semiconductor.

The conductive clad layer (not illustrated) may be formed on or/and under the active layer. The conductive clad layer may be formed with GaN-based semiconductor.

The second conductive type semiconductor layer 124 is foamed on the active layer 122. The second conductive type semiconductor layer 124 may be formed with group III-V compound semiconductor doped with the second conductive dopant, e.g., one of compound semiconductors such as GaN, InN, AlN, InGaN, AlGaN, InAlGaN, and AlInN. In the case that the second conductive type semiconductor layer 124 is P-type semiconductor layer, the second conductive dopant may include Mg, Zn, Ca, Sr, and Ba as P-type dopant.

The semiconductor layers 120, 122, and 124 may be grown to the crack-free thin films due to the substrate 114. Such crack-free thin film is capable of preventing current concentration so that the active layer 122 may be protected and the internal quantum efficiency and external quantum efficiency may be improved.

The first conductive type semiconductor layer 120 may be formed with P-type semiconductor layer, and the second conductive type semiconductor layer 124 may be formed with N-type semiconductor layer. N-type semiconductor layer or P-type semiconductor layer may be formed on the second conductive type semiconductor layer 124 as a third conductive type semiconductor layer. The first conductive type semiconductor layer 120, the active layer 122, and the second conductive type semiconductor layer 124 may be defined as the light emitting structure layer. The light emitting structure layer may be embodied as one of the structures of N-P junction, P-N junction, N-P-N junction, and P-N-P junction.

At least one of a current diffusion layer and a second electrode may be formed on the second conductive type semiconductor layer or the third conductive type semiconductor layer. The current diffusion layer includes the transparent electrode or the reflection electrode layer. The transparent electrode layer may be formed with material selected from metal oxide and metal on the second conductive type semiconductor layer 124. For instance, the transparent electrode layer may be formed in a single layer or multi layers using one or more of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ ITO, Ni, Ag, Ni/IrOx/Au, and Ni/IrOx/Au/ITO.

The reflection layer may be formed with material composed of Ag, Ni, Al, Rh, Pd, Ir, Ru, Mg, Zn, Pt, Au, and Hf and their selective combination on the second conductive type semiconductor layer 124. The second electrode is electrically connected to the second conductive type semiconductor layer 124 or the transparent electrode layer and may be formed with metal material. The second electrode may include the electrode pad and may be formed as the current diffusion pattern.

Figure 7:
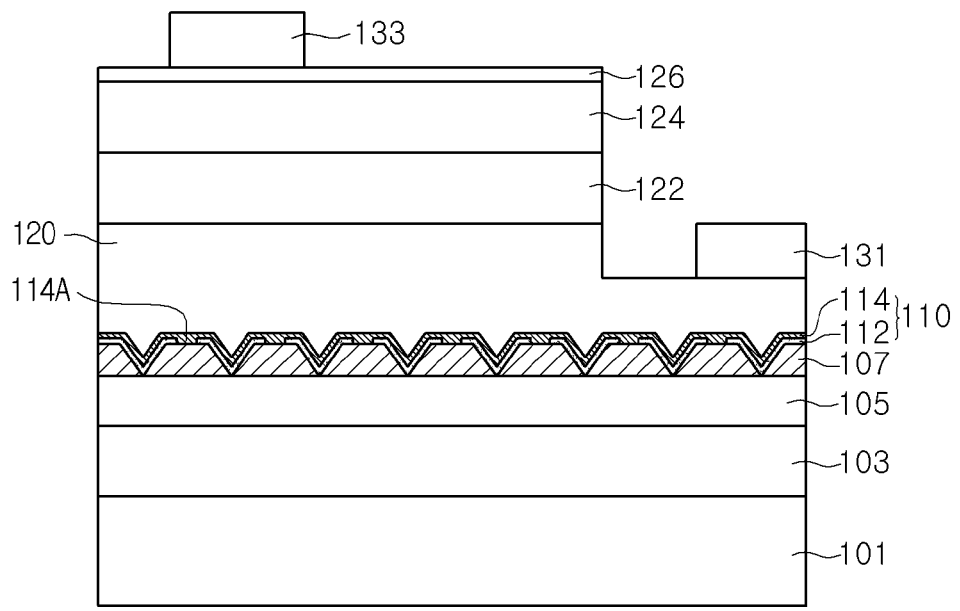
FIG. 7 is a diagram illustrating a light emitting device having a lateral electrode structure and using the embodiment illustrated in FIG. 1.

FIG. 7 is a side-sectional view illustrating a light emitting device having a lateral electrode structure and using the embodiment illustrated in FIG. 1.

Referring to FIG. 7, at a light emitting device 100A, the upper surface of the first conductive type semiconductor layer 120 is exposed, and a first electrode 131 is formed on the first conductive type semiconductor layer 120. The process of exposing the first conductive type semiconductor layer 120 may be performed through a mesa etching process.

On the second conductive type semiconductor layer 124, the current diffusion layer such as the transparent electrode layer or reflection electrode layer may be formed in a second electrode layer 126. A second electrode 133 may be formed on the second electrode layer 126. The second electrode 126 may be formed with indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), metal oxide, or metal such as Al, Ag, Pd, Rh, Pt, or Ir, or alloy of selected metals.

The second electrode 133 may be formed with at least one metal layer, e.g., one or combination from Ag, Ag alloy, Ni, Al, Al alloy, Rh, Pd, Ir, Ru, Mg, Zn, Pt, Au, and Hf. The second electrode 133 may include an electrode pad, or a separate electrode pad may be formed. The second electrode 133 may be directly contacted to the second electrode layer or/and the second conductive type semiconductor layer 124.

Since the light emitting device 100A may improve the dislocation by the nonconductive layer 112 under the active layer 122, there is an effect of increasing light efficiency due to crystallinity of light and improving ESD.

Figure 8:
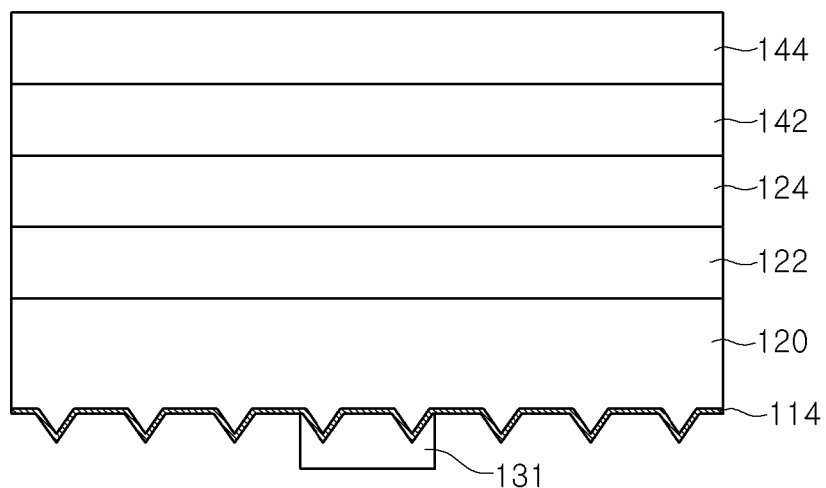
FIG. 8 is a diagram illustrating a light emitting device having a vertical electrode structure and using the embodiment illustrated in FIG. 1.

FIG. 8 is a side-sectional view illustrating a light emitting device having a vertical electrode structure and using the embodiment illustrated in FIG. 1.

Referring to FIG. 8, a plurality of conductive layers 142 and 144 may be formed on the second conductive layer 124 illustrated in FIG. 6. The conductive layers include a first conductive layer 142 disposed on the second conductive type semiconductor layer 124 and a second conductive layer 144 on the first conductive layer 142. The first conductive layer 142 includes an ohmic layer or/and reflection layer. The first conductive layer 142 is formed with metal or alloy including at least one among reflection members such as Al, Ag, Pd, Rh, Pt, and Ir. The second conductive layer 144 is a conductive support member and may be formed to a thickness of more than tens of micro meters. The second conductive layer 144 may selectively include copper (Cu), gold (Au), nickel (Ni), molybdenum (Mo), copper-tungsten (Cu—W), and carrier wafer (e.g., Si, Ge, GaAs, ZnO, SiC, SiGe, $Ga_2O_3$). The first conductive layer 142 and the second conductive layer 144 supply power of a second polarity. At least one layer or pattern may be formed between the first conductive layer 142 and the second conductive type semiconductor layer 120. Material for the at least one layer or pattern is oxide material such as ITO, and it may be formed in an ohmic contact layer or/and current blocking layer.

The substrate 101 of FIG. 6 under the buffer layer 103 may be eliminated in a physical or/and chemical method. Laser Lift Off (LLO) method may be used as the method of eliminating the substrate. According to the LLO method, the second conductive layer 144 is disposed on a base, and then, laser of a predetermined wavelength is irradiated to the substrate 101 for eliminating it.

The buffer layer 103 and the first semiconductor layer 105 are eliminated through a wet etching. The buffer layer 103 and the first semiconductor layer 105 may be eliminated by selectively using dry etching and polishing.

The nonconductive layer 112 of FIG. 5 under the first conductive type semiconductor layer 120 except for the substrate layer 114 may also be eliminated. Herein, in the case that the substrate layer 114 is SiC, it may not be eliminated. The first electrode 131 is formed under the substrate layer 114. Accordingly, a light emitting device 100B having the vertical electrode structure is embodied.

Since the substrate layer 114 is formed in the uneven structure by the nonconductor of cluster form in the light emitting device 100B, the light extraction efficiency may be improved.

Figure 9:
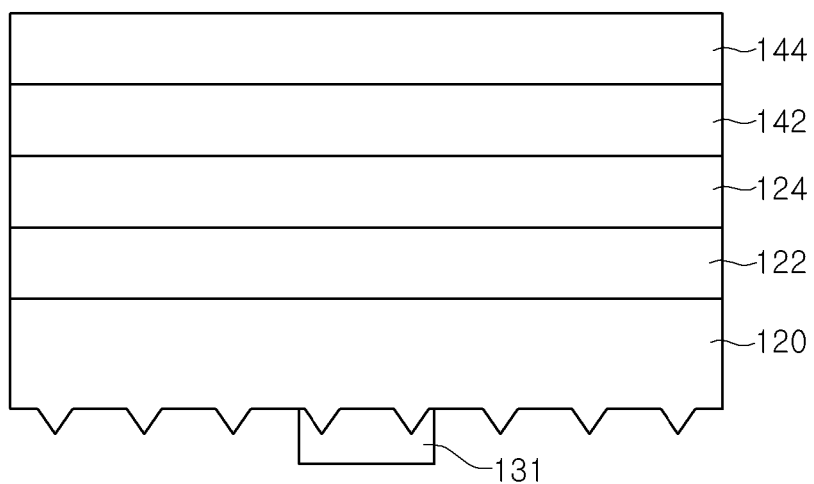
FIG. 9 is a diagram illustrating another light emitting device having the vertical electrode structure.

FIG. 9 is a diagram illustrating another light emitting device having the vertical electrode structure. For explaining the embodiment, the same parts in comparison with FIG. 8 are described referring to FIG. 8, and overlapped explanations are omitted.

Referring to FIG. 9, in a light emitting device 100C, the first electrode 131 is disposed to the first conductive type semiconductor layer 120. By further removing the substrate layer of FIG. 8, the first conductive type semiconductor layer 120 is exposed to form the first electrode 131. Herein, a lower surface of the first conductive type semiconductor layer 120 may be formed in the roughness structure. Such roughness structure is formed through removing the substrate layer and it is unnecessary to perform a special etching process to the conductive type semiconductor layer 120.

Figure 10:
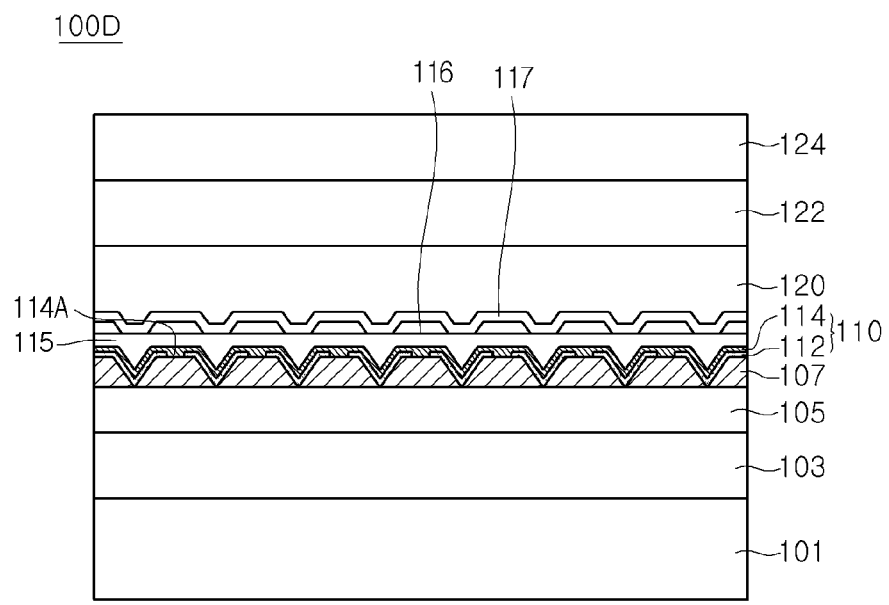
FIG. 10 is a side-sectional view illustrating a light emitting device according to a second embodiment.

FIG. 10 is a side-sectional view illustrating a light emitting device according to a second embodiment. For explaining the second embodiment, the same parts in comparison with the first embodiment are referred to as the same numeric and overlapped explanations are omitted.

Referring to FIG. 10, a light emitting device 100D includes a substrate 101, a buffer layer 103, a first semiconductor layer 105, an uneven part 107, a first nonconductive layer 112, a first substrate layer 114, a second semiconductor layer 115, a second nonconductive layer 116, a second substrate layer 117, a first conductive type semiconductor layer 120, an active layer 122, and a second conductive type semiconductor layer 124.

The first nonconductive layer 112 and the first substrate 114 are formed in at least one period on the uneven part 107. The first nonconductive layer 112 and the first substrate 114 refer to the nonconductive layer and the substrate layer of FIG. 1.

The second semiconductor layer 115 may be formed with group III-V compound semiconductor doped with the first conductive dopant, e.g., GaN, InN, AlN, InGaN, AlGaN, InAlGaN, and AlInN, on the first substrate layer 114. An upper surface of the second semiconductor layer 115 may be even or uneven.

The second nonconductive layer 116 may be formed with a cluster having nonconductive characteristics. For instance, the second nonconductive layer 116 is formed with nonconductor and MgN, SiN, and ZnN and may be discontinuously formed on the second semiconductor layer 115. The second nonconductive layer 116 may be formed in nonconductor using, e.g., the first conductive dopant or/and second conductive dopant.

The second semiconductor layer 115 may be disposed between the second substrate layer 117 and the first substrate layer 114. The second substrate 117 is formed on the second nonconductive layer 116 and its portion may be contacted on the second semiconductor layer 115. The second substrate layer 117 may be selected among substrate materials such as conductive layer, nonconductive layer, and insulating layer. The second substrate layer 117 may be formed with SiC and SiN.

The second nonconductive layer 116 and the second substrate layer 117 may be formed in at least one period. In the case that the second semiconductor layer 115 is the first conductive semiconductor, the second nonconductive layer 116 and the second substrate layer 117 may be disposed in the first conductive type semiconductor layers 115 and 120. The light emitting device 100D suppresses the dislocation transferred from below of the active layer 122 so that crack-free surface of layer may be provided.

The light emitting device according to the embodiments may be packaged on a semiconductor substrate of resin material or silicon, an insulating substrate, and a ceramic substrate, and it may be used as a system light source of indicating devices, illumination devices, display devices, and the like.

Figure 11:
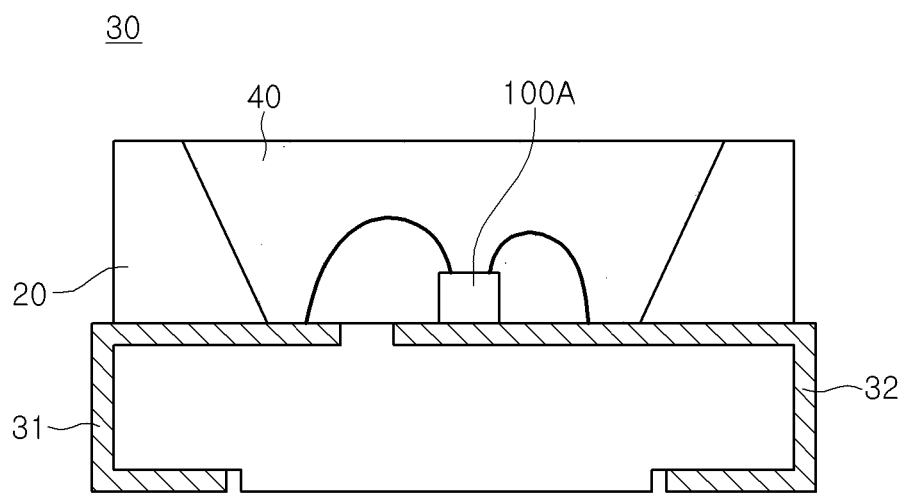
FIG. 11 is a side-sectional view illustrating a light emitting device package according to an embodiment.

FIG. 11 is a diagram illustrating a light emitting device package according to an embodiment.

Referring to FIG. 11, a light emitting device package 30 includes a body 20, a first lead electrode 31 and a second lead electrode 32 disposed at the body 20, a light emitting device 100A according to the embodiment, and a molding member 40 covering the light emitting device 100A. Herein, the light emitting device is disposed at the body 20 and electrically connected to the first lead electrode 31 and the second lead electrode 32.

The body 20 may be formed including the conductive substrate such as silicon, synthetic resins such as PPA, ceramic substrate, insulating substrate, or metal substrate (e.g., MCPCB). The body 20 includes a concave part such as a cavity whose upper part is open. At the concave part, the light emitting device 100A is disposed, and the first and second lead electrodes 31 and 32 are exposed. A sloping surface may be formed on the circumference of the concave part. The body 20 may include a through-hole structure, and it is not limited to this.

The first lead electrode 31 and the second lead electrode 32 are electrically separated from each other and supply power to the light emitting device 100A. The first lead electrode 31 and the second lead electrode 32 may also increase light efficiency by reflecting light generated from the light emitting device 100A and may serve to emit heat generated from the light emitting device 100A.

The light emitting device 100A may be installed on the body 20, or on the first lead electrode 31 or the second lead electrode 32.

The light emitting device 100A may be connected to the first lead electrode 31 and the second lead electrode 32 through a wire.

The molding member 40 may surround the light emitting device 100A to protect the light emitting device 100A. Also, a fluorescent substance may be included in the molding member 40 so that wavelength of light emitted from the light emitting device 100A may be varied. A lens may be disposed on the molding member 40, and the lens may be embodied as a form to be contacted or not to be contacted to the molding member 40.

The light emitting device 100A may be electrically connected to a lower surface of the body or substrate through the through-hole.

On the light emitting device package 30, at least one of the light emitting devices of the above-described embodiments may be installed, and there is no limit for this.

Although the light emitting device package has been described as a top view form, it may also be embodied as a side view method so that the above-described heat radiating characteristics, conductivity and reflection characteristics may be improved. The light emitting device according to the top view or side view method may be packaged by the resin layer as above-described, and then, the lens may be formed or attached on the resin layer; there is no limit for this.

[Illumination System]

The light emitting device or light emitting device package according to the embodiments may be applied to an illumination system. The illumination system may include a structure of an array of a plurality of light emitting devices or light emitting device packages.

Figure 12:
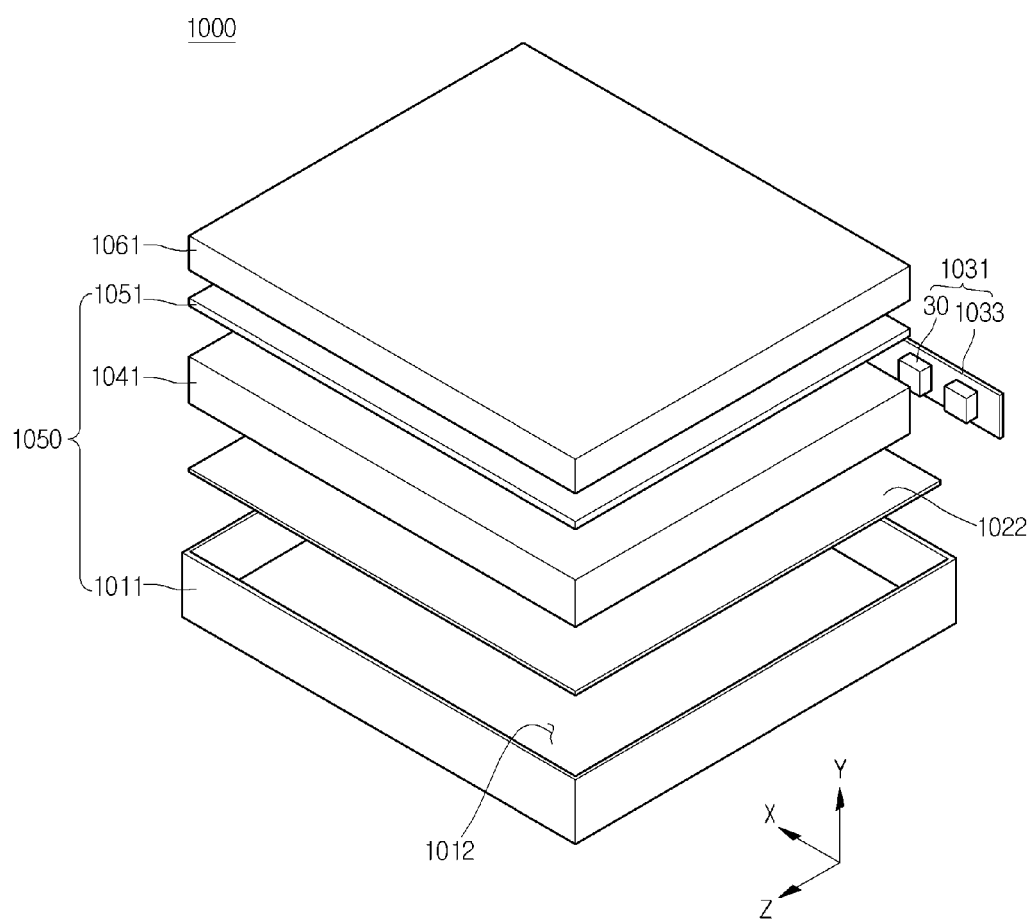
FIG. 12 is a diagram illustrating a display device according to an embodiment.
Figure 13:
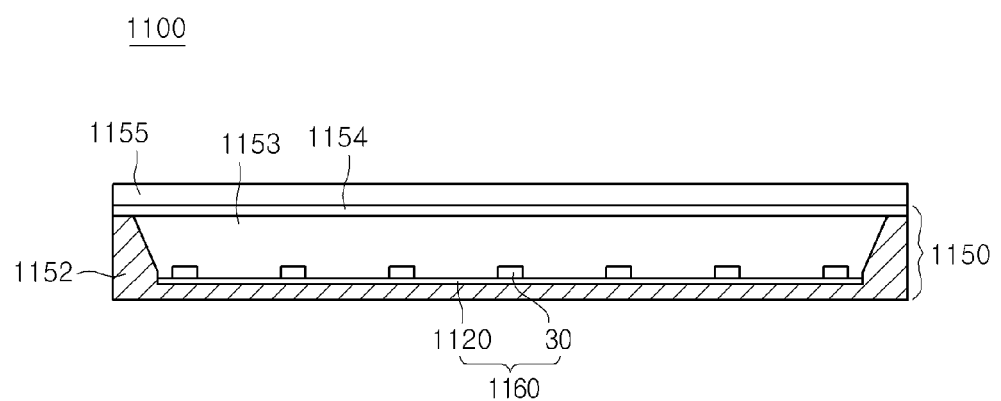
FIG. 13 is a diagram illustrating another display device according to an embodiment.
Figure 14:
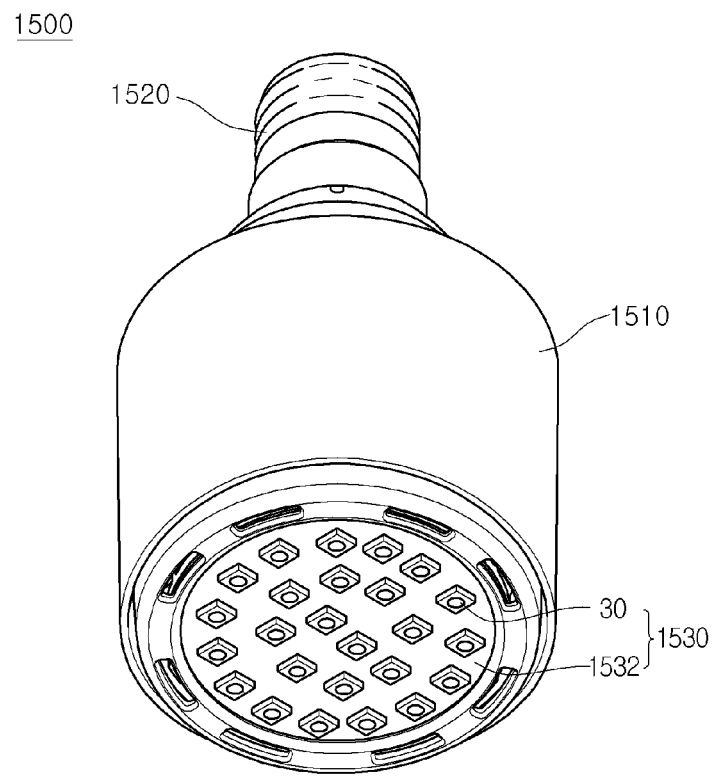
FIG. 14 is a diagram illustrating an illumination device according to an embodiment.

The illumination system may include display devices illustrated in FIGS. 12 and 13, an illumination device illustrated in FIG. 14, illumination lamps, signal lights, car headlights, electronic displays, and the like.

FIG. 12 is an exploded perspective view illustrating a display device according to an embodiment.

Referring to FIG. 12, a display device 1000 according to the embodiment may include a light guide plate 1041, a light emitting module 1031 providing light to the light guide plate 1041, a reflection member 1022 under the light guide plate 1041, an optical sheet 1051 on the light guide plate 1041, a display panel 1061 on the optical sheet 1051, and a bottom cover 1011 storing the light guide 1041, the light emitting module 1031, and the reflection member 1022; however, it is not limited to this.

The bottom cover 1011, the reflection sheet 1022, the light guide plate 1041, and the optical sheet 1051 may be defined as a light unit 1050.

The light guide plate 1041 serves to diffuse light for convergence to a surface light source. The light guide plate 1041 is formed with transparent material and, e.g., may include one of acrylic resin such as polymethyl metaacrylate (PMMA), polyethylene terephthlate (PET), poly carbonate (PC), cycloolefin copolymer (COC), and polyethylene naphthalate (PEN) resins.

The light emitting module 1031 provides light to at least one side of the light guide plate 1041 and ultimately acts as a light source of the display device.

At least one light emitting module 1031 is included, and it may provide light directly or indirectly at one side of the light guide plate 1041. The light emitting module 1031 includes a substrate 1033 and the light emitting device package 30 according to the above-disclosed embodiment. The light emitting device package 30 may be arrayed at predetermined intervals on the substrate 1033.

The substrate 1033 may be a Printed Circuit Board (PCB) including a circuit pattern (not illustrated). However, the substrate 1033 may include not only the typical PCB but also a metal core PCB (MCPCB) and a flexible PCB (FPCB), and it is not limited to this. In the case that the light emitting device package 30 is installed on the side of the bottom cover 1011 or on a heat radiating plate, the substrate 1033 may be eliminated. Herein, a part of the heat radiating plate may be contacted to an upper surface of the bottom cover 1011.

The plurality of light emitting device packages 30 may be installed on the substrate 1033 so that a light-emitting surface is separated from the light guide plate 1041 by a predetermined distance, and there is no limit for this. The light emitting device package 30 may provide light to a light-entering part, i.e., one side, of the light guide plate 1041 directly or indirectly, and there is no limit for this.

The reflection member 1022 may be disposed under the light guide plate 1041. The reflection member 1022 reflects the light incident to the lower surface of the light guide plate 1041 in an upward direction so that brightness of the light unit 1050 may be improved. The reflection member 1022 may be formed with, e.g., PET, PC, PVC resins; however, it is not limited to this. The reflection member 1022 may be the upper surface of the bottom cover 1011; however, there is no limit for this.

The bottom cover 1011 may store the light guide plate 1041, the light emitting module 1031, and the reflection member 1022. To this end, the bottom cover 1011 may be provided with a storing unit 1012 having a shape of a box whose upper surface is open, and there is not limit for this. The bottom cover 1011 may be combined with a top cover, and there is no limit for this.

The bottom cover 1011 may be formed with metal material or resin material and may be fabricated using processes of press or extrusion molding. The bottom cover 1011 may also include metal or non-metal material having good thermal conductivity, and there is no limit for this.

The display panel 1061 is, e.g., an LCD panel, and includes transparent first and second substrates, and a liquid crystal layer between the first and second substrates. On at least one side of the display panel 1061, a polarizing plate may be attached; however, the attaching structure is not limited to this. The display panel 1061 displays information by the light which passes through the optical sheet 1051. The display device 1000 may be applied to various cell phones, monitors of notebook computers, monitors of laptop computers, and televisions.

The optical sheet 1051 is disposed between the display panel 1061 and the light guide plate 1041 and includes at least one translucent sheet. The optical sheet 1051 may include at least one of, e.g., diffusion sheet, horizontal and vertical prism sheets, and brightness enhancement sheet. The diffusion sheet diffuses the incident light. The horizontal or/and vertical prism sheet concentrates the incident light to a display region. The brightness enhancement sheet reuses lost light to enhance brightness. A protection sheet may be disposed on the display panel 1061, and there is no limit for this.

Herein, on the light path of the light emitting module 1031, the light guide plate 1041 and the optical sheet 1051 may be included as optical members; however, there is no limit for this.

FIG. 13 is a diagram illustrating a display device according to an embodiment.

Referring to FIG. 13, a display device 1100 includes a bottom cover 1152, a substrate 1120, an optical member 1154, and a display panel 1155. Herein, the above-disclosed light emitting device packages 30 are arrayed on the substrate 1120.

The substrate 1120 and the light emitting device package 30 may be defined as a light emitting module 1060. The bottom cover 1152, at least one light emitting module 1060, and the optical member 1154 may be defined as a light unit.

The bottom cover 1152 may be provided with a storing unit 1153, and there is no limit for this.

Herein, the optical member 1154 may includes at least one of the lens, light guide plate, diffusion sheet, horizontal and vertical prism sheets, and brightness enhancement sheet. The light guide plate may be formed with PC material or polymethyl metaacrylate (PMMA) material, and this light guide plate may be eliminated. The diffusion sheet diffuses the incident light. The horizontal or/and vertical prism sheet concentrates the incident light to the display region. The brightness enhancement sheet reuses lost light to enhance brightness.

The optical member 1154 is disposed on the light emitting module 1060. The optical member 1154 converts the light emitted from the light emitting module 1060 to the surface light source, or performs diffusing and concentrating light.

FIG. 14 is a perspective view illustrating an illumination device according to an embodiment.

Referring to FIG. 14, an illumination device 1500 may include a case 1510, a light emitting module 1530 installed to the case 1510, and a connection terminal 1520 installed to the case 1510 and provided with power from an external power source.

It is preferable to form the case 1510 with material which has good heat radiation characteristics. For instance, the case 1510 may be formed with metal material or resin material.

The light emitting module 1530 may include a substrate 1532 and the light emitting device package 30 according to the embodiment installed on the substrate 1532. The plurality of light emitting device packages 30 may be arrayed in a matrix form or may be arrayed being separated from each other at predetermined intervals.

The substrate 1532 may be an insulator where a circuit pattern is printed. For instance, the substrate 1532 may include the PCB, metal core PCB, flexible PCB, ceramic PCB, and FR-4 substrate.

The substrate 1532 may also be formed with material which efficiently reflects light, or its surface may be coated with color, e.g., white and silver, which efficiently reflects light.

At least one light emitting device package 30 may be installed on the substrate 1532. Each of the light emitting device packages 30 may include at least one Light Emitting Diode (LED) chip. The LED chip may include a light emitting diode of visible light such as red, green, blue, or white or a UV light emitting diode which emits Ultra Violet (UV).

A combination of various light emitting device packages 30 may be disposed in the light emitting module 1530 for obtaining color tone and brightness. For instance, for securing high Color Rendering Index (CRI), a white light emitting diode, a red light emitting diode, and a green light emitting diode may be combined and disposed.

The connection terminal 1520 may be electrically connected to the light emitting module 1530 to supply power. The connection terminal 1520 is screwed to be connected to the external power source in a socket method; however, there is no limit for this. For instance, the connection terminal 1520 may be formed in a pin shape to be inserted into the external power source or may be connected to the external power source by a wire.

Features of the above-disclosed embodiments are not limited to the embodiments but may be selectively applied to other embodiments. Other modifications and applications are possible through selective combination within the technical scope of the embodiments.

A method for fabricating the light emitting device according to the embodiment includes forming a first semiconductor layer on a substrate using compound semiconductor; forming an uneven part including nitride semiconductor on the first semiconductor layer; forming a discontinuous nonconductive layer on the uneven part; forming a substrate layer on the nonconductive layer; and forming a plurality of compound semiconductor layers on the substrate layer.

According to the embodiments, the dislocation from below of the active layer can be improved, and the crystallinity of the semiconductor layer can be improved, and the light emitting efficiency can be improved. The reliability of the light emitting device and the light emitting device package can also be improved.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a first semiconductor layer;
a plurality of convex structures disposed on a top surface of the first semiconductor layer;
a first uneven layer on a top surface of the plurality of convex structures;
a nonconductive layer between the top surface of the plurality of convex structures and the first uneven layer; and
a light emitting structure layer disposed on a top surface of the first uneven layer, the light emitting structure layer including a first conductive semiconductor layer, an active layer on the first conductive semiconductor layer and a second conductive semiconductor layer on the active layer,
wherein the nonconductive layer includes a contact portion contacted directly with the top surface of the plurality of convex structures,
wherein the nonconductive layer is formed of a different material from the plurality of convex structures and the first uneven layer,
wherein the first uneven layer is formed of a different material from the plurality of convex structures,
wherein the plurality of convex structures are disposed in a discontinuous structure on the top surface of the first semiconductor layer, and
wherein the nonconductive layer includes at least one selected from a group of MgN, SiN, and ZnN.

2. The light emitting device according to claim 1, wherein the plurality of convex structures are formed of a III-V compound semiconductor.

3. The light emitting device according to claim 1, wherein the nonconductive layer is disposed between the plurality of convex structures.

4. The light emitting device according to claim 1, wherein the nonconductive layer is formed of a plurality of clusters spaced apart from each other.

5. The light emitting device according to claim 1, wherein the nonconductive layer includes a metal nitride.

6. The light emitting device according to claim 1, wherein the first uneven layer is formed of a conductive layer.

7. The light emitting device according to claim 1, wherein the first uneven layer is formed of an insulating layer.

8. The light emitting device according to claim 1, wherein the first uneven layer includes material whose lattice constant difference with nitride-based semiconductor is equal to or lower than about 5%.

9. The light emitting device according to claim 1, wherein the first uneven layer includes an n-type dopant.

10. A light emitting device, comprising:
a first semiconductor layer;
a plurality of convex structures disposed on a top surface of the first semiconductor layer;
a first uneven layer on a top surface of the plurality of convex structures;
a nonconductive layer between the top surface of the plurality of convex structures and the first uneven layer; and
a light emitting structure layer disposed on a top surface of the first uneven layer, the light emitting structure layer including a first conductive semiconductor layer, an active layer on the first conductive semiconductor layer and a second conductive semiconductor layer on the active layer,
wherein the nonconductive layer includes a contact portion contacted directly with the top surface of the plurality of convex structures,
wherein the nonconductive layer is formed of a different material from the plurality of convex structures and the first uneven layer,
wherein the first uneven layer is formed of a different material from the plurality of convex structures,
wherein the first uneven layer includes a carbon-containing material or a silicon-containing material, and
wherein the nonconductive layer includes at least one selected from a group of MgN, SiN, and ZnN and the first uneven layer includes at least one of SiC, SiN, SiCN, and CN.

11. A light emitting device, comprising:
a first semiconductor layer;
a plurality of convex structures disposed on a top surface of the first semiconductor layer;
a first uneven layer on a top surface of the plurality of convex structures;
a nonconductive layer between the top surface of the plurality of convex structures and the first uneven layer; and
a light emitting structure layer disposed on a top surface of the first uneven layer, the light emitting structure layer including a first conductive semiconductor layer, an active layer on the first conductive semiconductor layer and a second conductive semiconductor layer on the active layer,
wherein the nonconductive layer includes a contact portion contacted directly with the top surface of the plurality of convex structures, wherein the nonconductive layer is formed of a different material from the plurality of convex structures and the first uneven layer, wherein the first uneven layer is formed of a different material from the plurality of convex structures, wherein the plurality of convex structures are disposed in a discontinuous structure on the top surface of the first semiconductor layer, and wherein the first conductive semiconductor layer has a dislocation density lower than that of the first semiconductor layer.

12. A light emitting device, comprising:

a first semiconductor layer;

a plurality of convex structures disposed on a top surface of the first semiconductor layer;

a first uneven layer on a top surface of the plurality of convex structures;

a nonconductive layer between the top surface of the plurality of convex structures and the first uneven layer;

a light emitting structure layer disposed on a top surface of the first uneven layer, the light emitting structure layer including a first conductive semiconductor layer, an active layer on the first conductive semiconductor layer and a second conductive semiconductor layer on the active layer; and a substrate under a lower surface of the first semiconductor layer and a second semiconductor layer between the first semiconductor layer and the substrate, wherein the nonconductive layer includes a contact portion contacted directly with the top surface of the plurality of convex structures, wherein the nonconductive layer is formed of a different material from the plurality of convex structures and the first uneven layer, wherein the first uneven layer is formed of a different material from the plurality of convex structures, and wherein the plurality of convex structures are disposed in a discontinuous structure on the top surface of the first semiconductor layer.

13. A light emitting device, comprising:

a first semiconductor layer, a plurality of convex structures on the first semiconductor layer;

a first uneven layer on a top surface of the plurality of convex structures;

a nonconductive layer between the top surface of the plurality of convex structures and the first uneven layer; and a light emitting structure layer disposed on a top surface of the first uneven layer, the light emitting structure layer including a first conductive semiconductor layer including an n-type dopant, an active layer on the first conductive semiconductor layer and a second conductive semiconductor layer including a p-type dopant on the active layer, wherein the plurality of convex structures is disposed between the first semiconductor layer and the first uneven layer, wherein the nonconductive layer is formed of a different material from the plurality of convex structures and the first uneven layer, wherein a portion of the nonconductive layer and a portion of the first uneven layer are disposed between the plurality of convex structures, wherein a portion of the first uneven layer contacts the plurality of convex structures and a side surface of the non-conductive layer, and wherein the nonconductive layer includes at least one selected from a group of MgN, SiN, and ZnN.

14. The light emitting device according to claim 13, wherein the plurality of convex structures are formed of a group III-V compound semiconductor and are disposed in a discontinuous structure on a flat top surface of the first semiconductor layer.

15. The light emitting device according to claim 13, wherein the nonconductive layer is formed of a cluster having a metal nitride.

16. The light emitting device according to claim 13, wherein the first uneven layer includes at least one of SiC, SiN, SiCN, and CN.

17. The light emitting device according to claim 13, wherein the nonconductive layer has a recess on the plurality of convex structures and the portion of the first uneven layer is disposed in the recess of the nonconductive layer.

* * * * *